Figure 1:
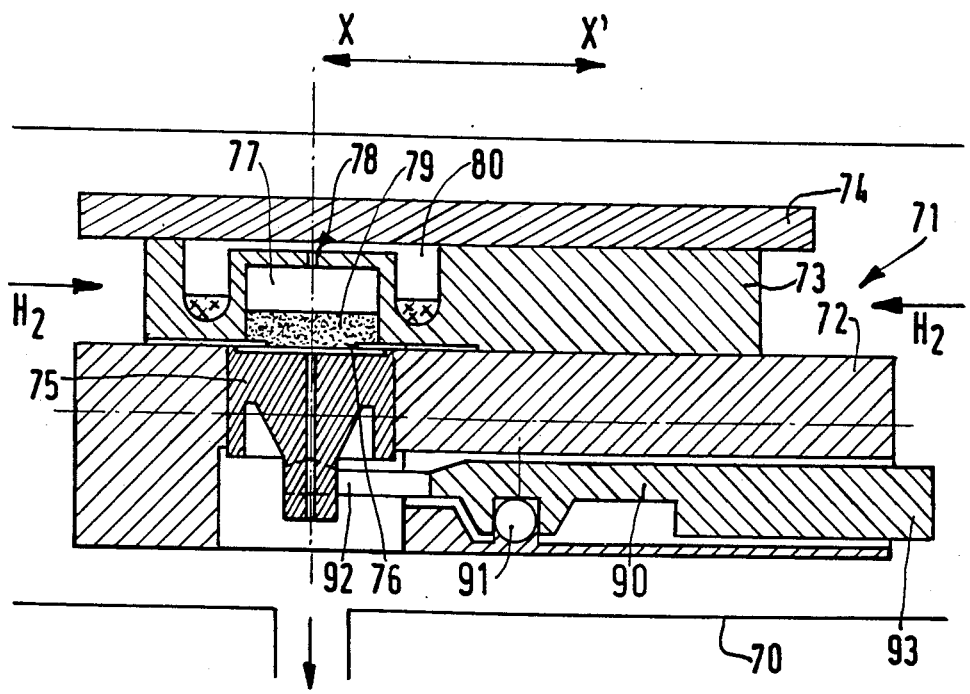

United States Patent [19]
Latorre et al.

[11] Patent Number: 4,748,933
[45] Date of Patent: Jun. 7, 1988

[54] CRUCIBLE FOR EPITAXY FROM THE LIQUID PHASE OF SEMICONDUCTOR LAYERS

[75] Inventors: Bernard Latorre, Vincennes; Guy N. Martin, Noiseau, both of France

[73] Assignee: U.S. Philips Corporation, New York, N.Y.

[21] Appl. No.: 921,928

[22] Filed: Oct. 20, 1986

[30] Foreign Application Priority Data

Oct. 22, 1985 [FR] France ............................ 85 15654

[51] Int. Cl.$^4$ .......................................... H01L 21/208
[52] U.S. Cl. ..................................... 118/415; 118/421
[58] Field of Search ...................... 118/421, 412, 415; 156/621, 622, 624; 148/171, 172

[56] References Cited

U.S. PATENT DOCUMENTS

3,940,296  2/1976  Van Oirschot et al. ......... 118/415 X
4,366,771  1/1983  Bowers et al. ...................... 118/415

*Primary Examiner*—John P. McIntosh
*Attorney, Agent, or Firm*—Paul R. Miller

[57] ABSTRACT

The invention relates to a crucible for the growth of epitaxial layers of chemical compounds formed from several chemical elements by means of epitaxial growth from the liquid phase comprising an elongated support (72), on which a movable part (73) slides longitudinally, the elongated support comprising at least one recess for accommodating a substrate (76) on which is to be deposited at least one epitaxial layer, the movable part comprising at least one cavity (77) receiving a mother source (79) formed from initial epitaxy materials, the cavity having on the surface adjoining the elongated support a lower opening whose dimensions correspond to the dimensions of the substrate (76) present therein. It is characterized in that the movable part (73) has throughout its length a longitudinal groove (81) on the surface which slides longitudinally on the elongated support, this groove having a depth slightly exceeding the irregularities of the substrate and sufficiently small in order that the mother source cannot pass by means of a capillary effect and a width smaller than the dimensions of the substrate in order that the latter cannot penetrate into it, and in that the recess of the elongated support accommodates an elevator (75) on which the substrate is placed, which holds the latter positioned on the lateral edges (82) of the groove (81), the elevator (75) being held in place by means of a small force developed by a pressure system, more particularly as asymmetrical lever (90) movable about an axis or a spring (85) of quartz.

4 Claims, 7 Drawing Sheets

CRUCIBLE FOR EPITAXY FROM THE LIQUID PHASE OF SEMICONDUCTOR LAYERS

The invention relates to a crucible for the growth of epitaxial layers of chemical compounds formed from several chemical elements by the method of epitaxy from the liquid phase comprising an elongated suport, on which a movable part slides longitudinally, with the support having at least one recess for receiving a substrate, on which at least one epitaxial layer is to be deposited and with the movable part having at least one cavity receiving a mother source formed by initial epitaxy materials, and the cavity having on the surface adjoining the support a lower opening, whose dimensions correspond to the dimensions of the substrate present therein with the crucible being intended to be disposed in a reactor brought to an epitaxy temperature.

An invention of this kind is known from U.S. Pat. No. 4,366,771. It is known according to this document to form layers of $Hg_{1-x}Cd_xTe$ in a crucible of graphite constituted by two blocks, a first block of which is traversed by cavities adapted to receive different source compositions with this first block being movable with respect to a second block receiving the substrate. The assembly of the crucible is arranged in a tubular furnace in which a flow of hydrogen circulates. The second block receives the substrate in a recess formed therein in such a manner that the substrate is level with the second block. The thicknesses of the substrates used successively have therefore to be calibrated as a function of the depth chosen for this recess.

The epitaxy is typically effected at a temperature of 450° C. to 500° C. for mother solutions rich in tellurium. When the required time has passed, the substrate with its epitaxial layer is separated from the liquid solution by a translatory movement. The construction of the crucible is such that the epitaxial layer is thus "wiped up" with the surface state remaining more or less correct according to the construction of the crucible and the nature of the constituents of the layer. The thickness of the layers contributes to the clearance existing between the upper level of the substrate and the movable block containing the mother solutions.

However, in the case of growth of epitaxial layers of $Hg_{1-x}Cd_xTe$, difficulties are met due to the high partial pressure of the mercury as compared with that of the cadmium and the tellurium. The mother source has a tendency to be impoverished in mercury and a constant composition of the epitaxial layers is no longer ensured in a correct manner.

In order to obviate this problem, the document U.S. Pat. No. 4,366,771 describes a crucible, in which the growth cavities communicate with a source of mercury. These cavities traverse the first movable block and are surrounded on both surfaces by small not very deep grooves which are interconnected on the respective upper and lower surfaces by a prolonged part of the grooves and between the two surfaces by a hole provided in the first movable block, which hole is situated at a certain distance from the cavities. During operation, a plug is arranged at the upper part of the cavity in order to obstruct its opening. The supply of Hg is therefore effected mainly from the upper part to the lower part of the first block through the hole so that the supplementary supply of vapours of mercury is effected at the level of the epitaxial layer in order to limit the loss of mercury to a minimum.

After the first layer has been formed, the substrate can be contacted with a second source to obtain a second layer having different properties.

However, it is not possible according to this technique to control correctly the space between the finished layer and the upper block connected with the thickness of the layer, which is a parameter determining the wiping, while it is not possible either to eliminate the variable tolerances with respect to the thicknesses of the substrates, to a greater extent with respect to the substrates already provided with one or several epitaxial layers. Multi-layer deposits can therefore be controlled only with great difficulty and the possibility of carrying out correctly the translation of the movable block is very limited.

On the other hand, the construction of this crucible does not permit controlling in an effective and reproducible manner the chemical composition of the layers and more particularly the content of mercury. In spite of the fact that the mercury pressure in the grooves can be slightly different from that existing above the solution, the small distance between the first block and the second block determines the flow of mercury exchanged between the mercury source and the solution. This small distance cannot be controlled from one operation to another.

The invention therefore has inter alia for its object to permit utilizing substrates whose tolerances with respect to the initial thicknesses are not accurately determined.

The invention further has for its object not to scratch the surface of the useful part of the epitaxial layer at the instant of the translation.

A further object is to permit obtaining multilayer structures having variable thicknesses.

For this purpose, the crucible as defined in the preamble is characterized in that the movable part has throughout its length a longitudinal groove on the surface which slides longitudinally on the support with this groove having a depth slightly larger than the irregularities of the substrates and sufficiently small in order that the mother solution cannot pass by a capillary effect and a width smaller than the dimensions of the substrate in order that the latter cannot penetrate into it, and in that the recess of the support accommodates an elevator on which the substrate is placed which holds it positioned on the lateral edges of the groove with the elevator being held in position by means of a small force developed by a pressure system.

The crucible according to the invention is preferably made of graphite, but it may alternatively be made of boron nitride or of a combination of graphite and quartz. The elevator slides with small friction into the recess of the support. The substrate, arranged on the elevator, will bear on the two lips of the longitudinal groove provided in the movable part. This groove typically has a depth of 30 μm. The initial products, such as Cd, Te and Hg for the growth of layers of $Hg_{1-x}Cd_xTe$ are arranged in a cavity of the movable part. After the crucible thus loaded has been arranged in a tubular furnace of quartz, in which circulates a reducing gas, such as hydrogen, the products become liquid at the epitaxy temperature, which for these materials is 450° C. to 500° C.

The substrate is held in contact with the liquid initial products for the duration necessary for the deposition of the required thickness of the epitaxial layer, for example half an hour for 30 μm. At the end of this duration, the movable part is longitudinally displaced on the support in the direction of the groove and the epitaxy is then terminated. During this operation, only the edges of the substrate in contact with the lips of the groove will exhibit small notches, while the major central part of the epitaxial layer has an excellent surface quality.

The substrate or during the following operation the last epitaxial layer is consequently always supported by the lips of the groove, which permits controlling the mechanical clearance and hence the quality of the layers, irrespective of the thickness of the substrates used.

This supporting force is developed by a pressure system constituted according to a first variation by a lever. The latter has an asymmetrical structure so that with respect to an axis traversing it one of its ends will be subjected to the forces of gravity and hence lift the other end, which thus developes the required supporting force. This pressure system is made as a whole of the same material as the crucible, for example of graphite, in order that any pollution is avoided and an excellent behaviour at high temperatures is obtained.

According to a second variation, the pressure system is constituted by a spring of a refractory non-metallic material constituted by a hollow cylindrical tube provided with recesses.

In semiconductor metallurgy, it is very often necessary to carry out movement operations within a closed space in which a given number of s tates of equilibrium of pressure, temperature and chemical composition prevail. The transmission of movements or forces proves to be difficult, although they generally have small amplitudes.

In order to solve this problem, the spring is preferably formed in a quartz tube, whose straight section is annular. This tube has recesses formed by means of, for example, a wire saw and merging into the hollow part of the tube. These recesses are provided substantially along a straight section and, after having traversed the first face of the internal surface of the cylindrical tube, they will preferably be level with the second face.

Adjacent recesses are provided at a relative distance e shifted by rotation with respect to the axis of the cylindrical tube so that all the recesses formed in the tube succeed each other in a helical distribution. Several recesses are consequently provided on the same generatrix at a distance T such that $n=(T/h+e)$. At a distance T, there are consequently n successive recesses, which are shifted by rotation through an angle of $360°/n$.

In order to obtain such a spring, use is preferably made of a multiwire saw, whose wires are at a relative distance T. Thus, all the recesses at a relative distance T are provided simultaneously. Subsequently, the quartz tube is rotated on its support through an angle of $360°/n$ and all the recesses at a relative distance T are again formed. The operation is carried out for the n rotations.

The refractory non-metallic material may be quartz, carbon or boron nitride. Preferably, the straight section of the hollow cylindrical tube is annular.

In the growth of epitaxial layers from the liquid phase, the elements constituting the material forming the epitaxial layer have natural vapour pressures which in most cases are greatly different. Thus, in the case of layers of $Hg_{1-x}Cd_xTe$, the natural partial pressures of each constitutibe element are for $x=0.3$:

$Cd \simeq 10^{-1}$ Pa at 500° C.
$Te \simeq 10^2$ Pa at 500° C.
$Hg \simeq 10^4$ Pa at 500° C.

This has the consequence that the liquid source will have a concentration which will vary in time.

The epitaxial layer formed from such a source having a non-stabilized concentration will itself have a composition which will vary as a function of its thickness. This is detrimental to the manufacture of semiconductor devices having accurately defined, stable and reproducible properties.

In order to overcome this difficulty, the crucible comprises a movable part having cavities provided at their upper part with an annular reservoir intended to receive a composition of the element of which the liquid mother solution has a tendency to be impoverished. The vapours emitted by this annular reservoir are in contact with the liquid solution contained in the cavity through at least one narrow conduit, which permits compensating for the impoverishment of the liquid mother solution by the vapours emitted by the annular reservoir.

The calibration of the conduit is determined in order that the supply of the most volatile element which it delivers compensates for the loss of the same element in the mother solution, which loss is obtained due to the leakages existing at the level of the epitaxial layer.

The layers of $Hg_{1-x}Cd_xTe$ are used to form infrared detectors operating in the wavelength range of 3 to 5 $\mu m$ or of 8 to 12/$\mu m$.

Figure 2:
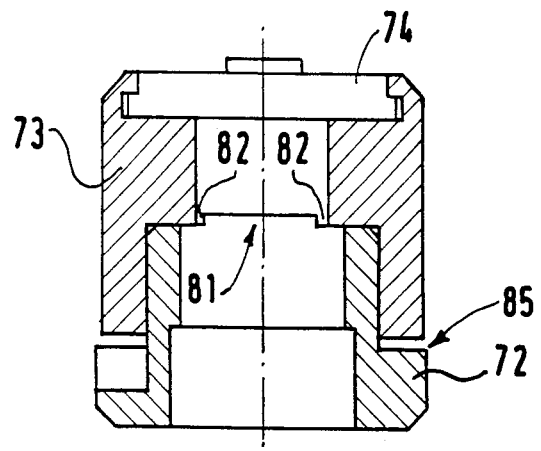
Figure 3:
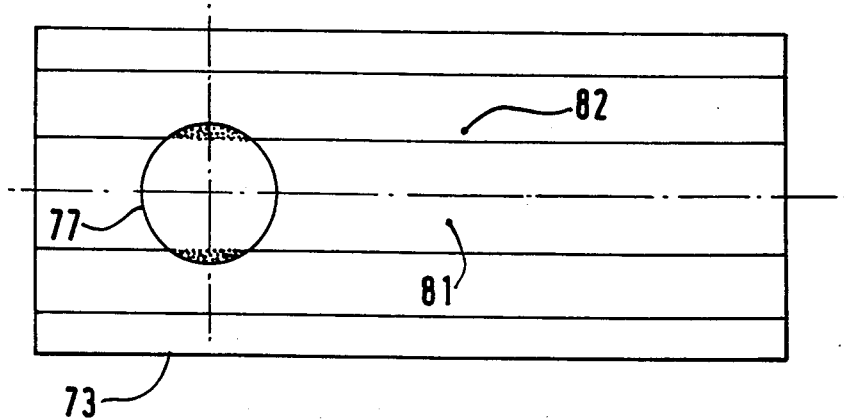
Figure 4:
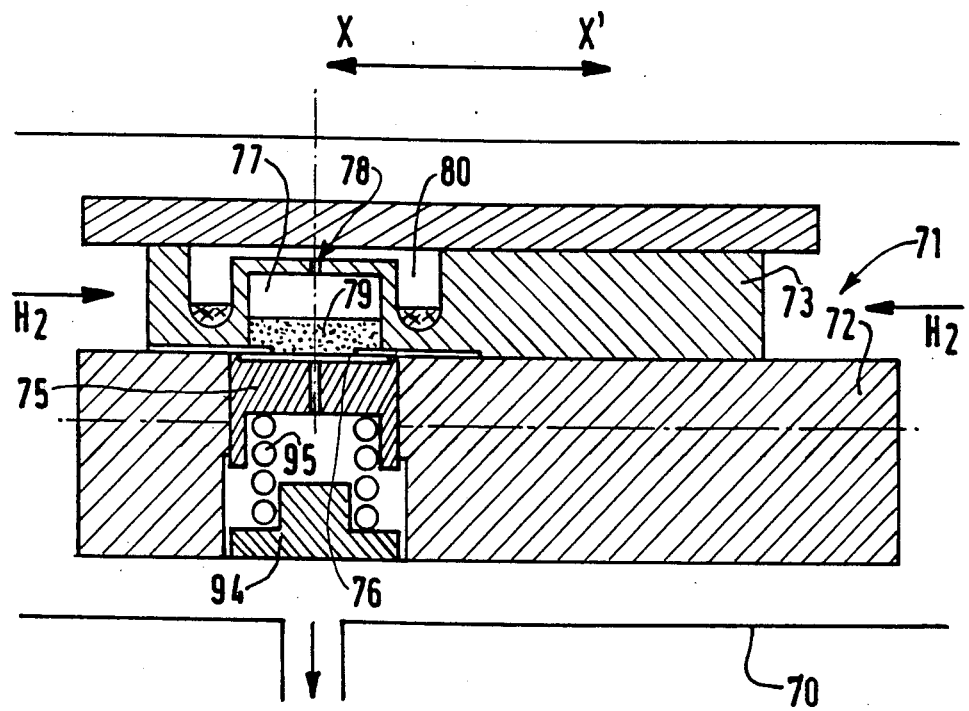
Figure 5:
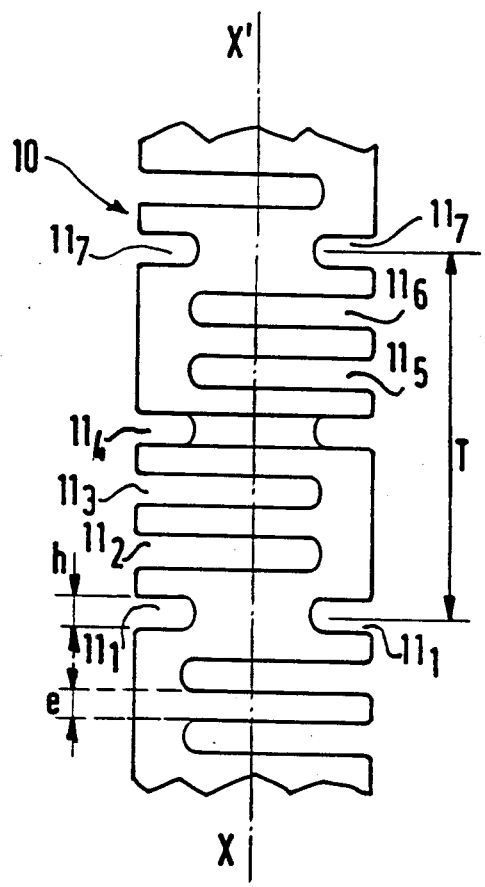
Figure 6:
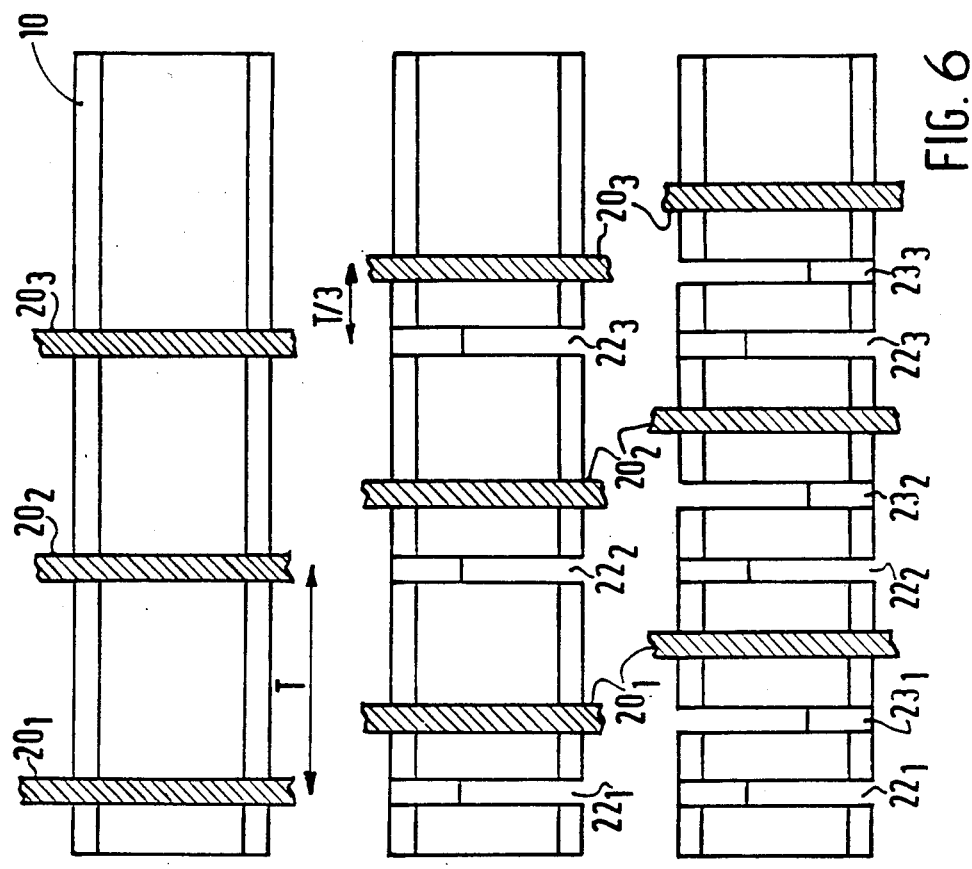
Figure 6:
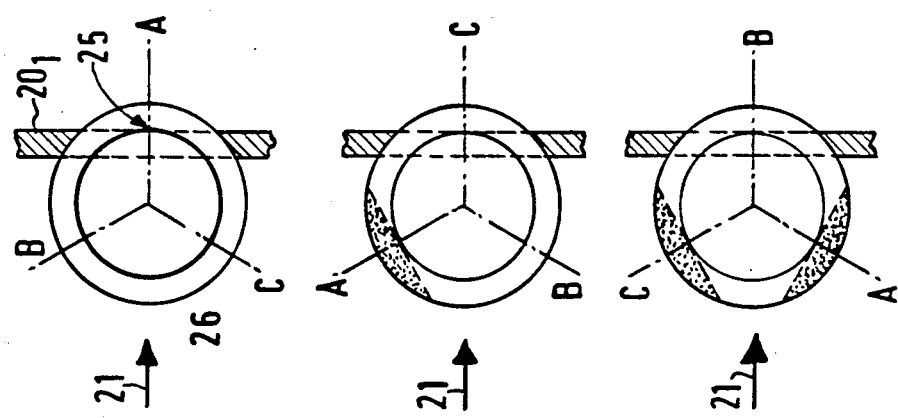
Figure 7:
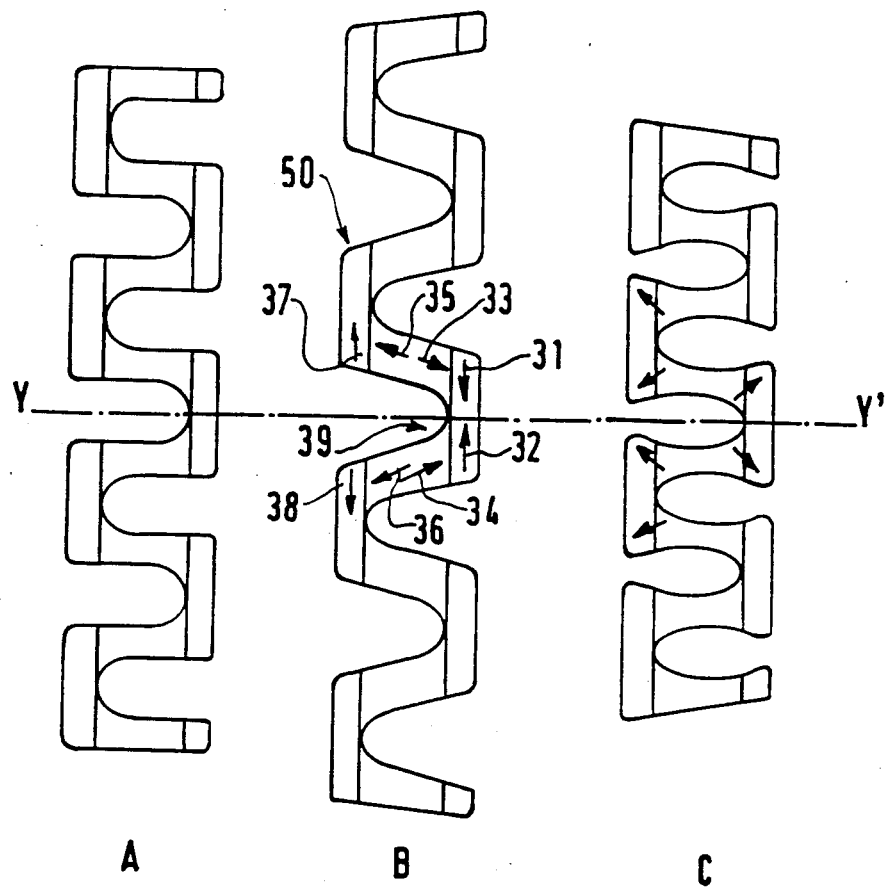
Figure 8:
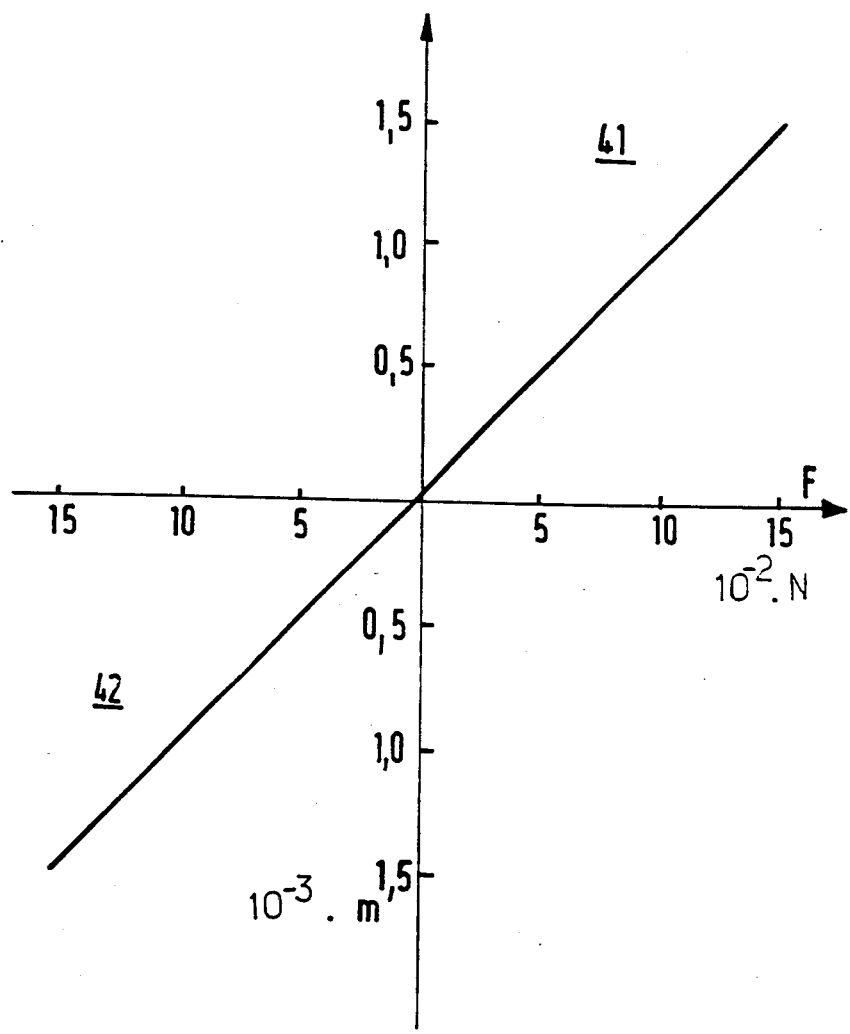

In order that the invention may be readily carried out, it will now be described more fully, by way of example, with reference to the accompanying drawings, in which:

FIG. 1 is a sectional view of a crucible according to the invention with an elevator actuated by a lever, FIG. 2 is a sectional view of the crucible according to the invention, FIG. 3 is a bottom view of the movable part of the crucible, FIG. 4 is a sectional view of a crucible according to the invention with an elevator actuated by a quartz spring, FIG. 5 shows a spring part according to the invention, FIG. 6 illustrates the cutting mechanism of a hollow cylindrical tube and of the spring thus obtained according to the invention with $n=3$, FIG. 7 is a sectional view along the axis of symmetry of the tube of a spring according to the invention, FIG. 8 shows a compression-expansion curve as a function of the force applied.

FIG. 1 shows an epitaxy furnace 70, which is generally constituted by a quartz tube surrounded by heater windings (not shown). Within this furnace is arranged a crucible 71 according to the invention. It is constituted by a support 72, by a movable part 73 and by a cover 74. These three elements slide one over the other with small friction in the direction XX', which is the axis of the tube of the epitaxy furnace. For this purpose, they are provided with lateral recesses, which permit their movements only in this direction.

The support 72 is recessed in order that an elevator 75 can pass, which can be displaced in a direction substantially at right angles to the support 72 by means of a force developed by a pressure system described in detail hereinafter. The elevator 75 carries a substrate 76, which is shown on an enlarged scale in the drawing for the sake of clarity.

The movable part 73 has a cavity 77 open in the direction of the support 72, but closed in its upper part except for a calibrated conduit 78, which connects it to a preferably annular receptable 80 intended to receive growth materials at high vapour tensions. The cavity 77 receives the solution rich in Te prepared beforehand for the growth of the layers of $Hg_{1-x}Cd_xTe$. At the epitaxy temperature, these materials constitute a liquid mother source 79. The substrate 76 has a dimension slightly exceeding the opening of the cavity 77 in order that the latter cannot penetrate into it.

FIG. 2 is a sectional view in a direction at right angles to the direction XX'. The movable part 73 has throughout its length and in the direction XX' a groove 81 of very small depth. Thus, the substrate can be in contact with the movable part 73 only through the two lateral lips 82 of the groove. In fact, when the movable part 73 is placed on the support 72, it can bear only on the two lateral lips 82 because a clearance 85 exists between the support 72 and the movable part 73.

FIG. 3 is a bottom view of the movable part 73. The groove 81 is slightly smaller than the cavity 77 so that the lateral lips 82 of the groove 81 do not exist in the cavity 77. Thus, when the movable part 73 is translated on the support 72 in the direction XX', only the surfaces of the substrate 76 which are in contact with the lips 82 will have small notches. These surfaces are indicated in FIG. 3 by a dotted line. The major central part of the substrate 76 thus remains in tact.

The depth of the groove 81 is determined in the first place by the fluidity of the mother solution at the epitaxy temperatues used. In fact, it is not necessary that this solution can pass by a capillary effect between the support 72 and the movable part 73. Consequently, the groove has to be as small as possible. A second limitation is determined by the quality of the surface state of the substrate. An acceptable surface state is, for example, that only one or two interference fringes can be seen for a substrate having a diameter of 15 mm. This is characteristic of both the surface state and the flatness of the substrate. In order to maintain for the layers obtained a very high surface quality, a groove having a depth of 30 $\mu$m has proved satisfactory.

The very stringent tolerances chosen for the clearance existing between the movable part 73 and the support 72 associated with a longitudinal groove of constant depth ensure that, even if the support 72 has several analogous areas for receiving several substrates, the quality of the surface state of all the layers is ensured.

FIG. 1 shows a crucible according to the invention, for which the pressure force is developed by a lever 90. This lever is arranged eccentrically with respect to an axis 91 so that the part 92 which is in contact with the elevator is subjected to an ascendant force. This is ensured by giving the part 93 of the lever a mass exceeding the part 92, for example, by influencing its form. Thus, the elevator 75 is pivoted upwards and places the substrate 76 on the lips 82 of the groove 81 of the movable part 73.

In the case of a crucible having several substrate carriers, a single lever can actuate simultaneously all the areas by means of a rocking lever system which distributes uniformly the overall pressure force produced by the lever.

FIG. 4 shows a crucible according to the invention, for which the pressure force is develope by a spring. This spring 95 is mounted on a support 94 which serves at the same time as a guide. This spring pushes the elevator 75 and hence the substrate 76 upwards against the movable part 73. The substrate is loaded upwards with the movable part 73 in lifted position. The spring is shown in FIG. 5.

FIG. 5 shows a spring 10 formed in a hollow cylindrical tube of quartz in the case of a spring having a pitch of six recesses $11_1$ to $11_6$. The recesses $11_1$ and $11_7$ are analogous to and are spaced apart by a pitch T. The recesses are spaced apart by a distance e and shifted by rotation with respect to the axis XX' through an angle of 360°/6=60° in the embodiment shown. The width of each recess is h.

FIG. 6 shows a preferred method of realizing the invention in the case of a pitch of three recesses for the sake of simplicity of the drawing. For this purpose a multiwire saw is used comprising, for example, three wires $20_1$, $20_2$, $20_3$ spaced apart by T. The width of the wires is substantially equal to h. Three cuts are effected ($22_1$, $22_2$, $22_3$) with the direction of penetration indicated by the arrow 21. The cuts are carried out until the wires are level with the inner wall 25, that is to say after having traversed the whole hollow zone 26 of the cylindrical tube.

In order to obtain a pitch of three recesses, the tube is then rotated with respect to its axis through an angle of 360°/3=120°, the position of the letters A, B, C representing this rotation in relief. The three wires are then displaced according to the longitudinal axis of the tube over a distance T/3 and three new recesses $23_1$, $23_2$, $23_3$ are formed. The operations of rotation and translation analogous to the preceding operations are effected and then three other recesses are formed.

In the most general case for a pitch comprising n recesses, the rotation pitch is 360°/n and the translation pitch of each wire is T/n.

FIG. 7 is a sectional view along the axis of symmetry of the tube of a spring according to the invention, but shown for a spring with a pitch of two recesses for the sake of clarity of the drawing. This structure is considerably simplified, but permits of visualizing more clearly the forces applied. The sectional view A shows a part of a spring in the rest position. Considering displacements carried out with respect to a central turn centered on the axis YY', there is obtained at B a spring in extended state and at C a spring incompressed state. In these two cases, there are shown on the central turn the directions of the forces applied, which are symmetrical to the axis YY'. The forces indicated by the arrows 31 and 33 act in the compressed state upon the forces indicated by the arrows 32 and 34. The forces indicated by the arrows 35 and 37 act in the extended state upon the forces indicated by the arrows 36 and 38. The composition of these forces reveals that a spring structure having sharp corners is less satisfactory than a structure having rounded corners. For this reason, the bottom of each recess, for example, 39, must preferably have a rounded structure. This can be readily obtained by a cutting operation carried out by means of a wire saw.

For the same reasons, the outer edges of each recess, such as 50, preferably have a rounded structure. This can be obtained by carrying out a local chemical etching treatment after the formation of the recesses.

The sectional view C shows the same spring in the compressed state with other directions of the forces applied. Also in this case, the preferred construction is that having rounded corners.

The sectional views of FIG. 7 show a voluntarily simplified example, but the same mechanisms of equilibrium of forces are obtained, however, in a much more complex manner than in springs according to the invention for pitches with a number of recesses exceeding 2.

FIG. 8 shows the deflection curve of expansion-compression as a function of the force applied for a quartz spring according to the invention. For a spring having the following geometrical properties:
 length: 20 mm
 number of recesses: 26
 pitch T=2.25 mm
 width of cut h=0.2 mm
 distance between cuts e=0.548 mm
 thickness of the wall of the tube=1 mm
 diameter d=18 mm.

The deflection curve as a function of the force is substantially linear. Its inclination is about $10^{-2}$ m/N. The spring operates equally satisfactorily in the compressed state (zone 41) as in the expanded state (zone 42). This spring can also support small torsional forces.

The springs of refractory non-metallic material just described can be used in the applications which require the transmission or the absorption of forces of small amplitude in conditions of high temperature. Such a spring can be used at temperatures exceeding 1000° C. when it is made of quartz, or carbon or of boron nitride while maintaining its basic elastic properties.

In these situations of high temperature, it moreover has the advantage that it substantially does not supply vapour by evaporation of its constitutive material or by emission of the absorbed gases, which permits using it in atmospheres requiring conditions of a high degree of cleanness.

Due to the fact that the elevator 75 slides freely in the support 72, it is possible to use substrates 76 having considerably less stringent thickness tolerances then according to the prior art. Likewise, when multilayers should be obtained, the cumulated thicknesses of the layers do not disturb the formation of the following layers.

The process of utilizing the movable crucible is as follows. The quantities of the basic products Cd, Te and Hg of the mother solution are determined in order to obtain the composition $Hg_{1-x}Cd_xTe$ required in accordance with the value given to x at a given temperature of equilibrium. In the aforementioned example, the masses of the mother solution are such that the height of the liquid bath is about 3 mm. In this case, the hydrodynamic behaviour of the solution is stable (technique of small baths). This solution is placed on the support 72 and is covered by the movable part 73 so that it penetrates into the cavity 77. During this operation, the cavity 77 is at a certain distance from the substrate 76, which is positioned on the elevator 75. If the supply of one or several volatile elements, mercury in the case of $Hg_{1-x}Cd_xTe$ should be controlled, a compensation source, in this case HgTe is also placed in the receptacles 80. This supply is necessary when the chemical composition of the layers of $Hg_{1-x}Cd_xTe$ should be accurately controlled. The crucible is then arranged in an epitaxy furnace at 450° C. to 500° C. in a flow of hydrogen. When the crucible reaches the desired temperature, the movable part 73 then containing the basic products Cd, Te and Hg in the form of a mother source in the liquid state is displaced longitudinally on the support 72 so that the mother source 79 is in contact with the substrate 76 and the growth of the epitaxial layer can begin. At the end of the epitaxy, the inverse operation is carried out. The movable part 73 is slipped on the support 72 and then the assembly of the crucible 71 is withdrawn from the furnace. The groove 81 arranged in the movable part 73 thus ensures that the surface of the epitaxial layer is perfectly wiped up. Only the two lateral parts, on which bear the lips 82 of the grooves, are slightly disturbed and hence are generally unutilizable. The utilizable central part can then be cut in order to form semiconductor devices intended to be used for infrared detection.

If other layers of different compositions should be grown, it is possible to place the substrate with its first epitaxial layer on the elevator and to utilize as before the cumulated thicknesses which do not form an obstacle for these new steps.

The crucible according to the invention just described has a receptable to control the composition of the layers. It is clear that layers with a good surface state can be grown without particular problems with respect to the thicknesses of substrates or epitacial layers without using the receptacle. More particularly the cavity 77 can then traverse throughout its diameter the whole movable part 73.

What is claimed is:

1. A crucible for growing epitaxial layers of multi-element chemical compounds by an epitaxial liquid phase technique comprising
 an elongated support having at least one recess through said elongated support, said at least one recess extending from an upper surface of said elongated support,
 an elevator structure disposed in said at least one recess, said elevator structure supporting a substrate, on which at least one epitaxial layer is to be deposited, at an upper portion of said elevator structure,
 a movable member disposed on said upper surface of said elongated support in a longitudinally sliding manner, said movable member having at least one cavity holding an epitaxial solution of initial epitaxial materials, said at least one cavity having a lower opening at a lower surface of said movable member adjoining said upper surface of said elongated support, said lower opening having dimensioned slightly less than said substrate,
 wherein said movable member has a longitudinal groove at said lower surface of said movable member, said longitudinal groove extending throughout the length of said movable member, and said longitudinal groove having a dimension above said lower surface of said movable member slightly larger than irregularities on said substrate, said dimension being sufficiently small such that said epitaxial solution is prevented from passing by a capillary effect,
 wherein said longitudinal groove has a width dimension smaller than dimensions of said substrate such that edge portions of said substrate are prevented from exposure to said longitudinal groove, and
 a pressure mechanism to hold said elevator structure and said substrate by a small force in a position against lateral edges of said longitudinal groove.

2. A crucible according to claim 1, wherein said dimension of said longitudinal groove above said lower surface of said movable member is of the order of 30 μm.

3. A crucible according to claim 1 or claim 2, wherein said pressure mechanism includes an asymmetrical lever movable about an axis.

4. A crucible according to claim 1 or claim 2, wherein said pressure mechanism includes a spring of one of quartz, graphite, or boron nitride.

* * * * *